US009490400B2

(12) United States Patent
Pihale et al.

(10) Patent No.: US 9,490,400 B2
(45) Date of Patent: Nov. 8, 2016

(54) OPTOELECTRONIC COMPONENT INCLUDING A CONVERSION ELEMENT AND METHOD OF PRODUCING AN OPTOELECTRONIC COMPONENT INCLUDING A CONVERSION ELEMENT

(71) Applicant: OSRAM Opto Semiconductors GmbH, Regonsburg (DE)

(72) Inventors: Sven Pihale, Ellingen (DE); Florian Eder, Erlangen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/897,343

(22) PCT Filed: Jun. 23, 2014

(86) PCT No.: PCT/EP2014/063158
§ 371 (c)(1),
(2) Date: Dec. 10, 2015

(87) PCT Pub. No.: WO2014/206937
PCT Pub. Date: Dec. 31, 2014

(65) Prior Publication Data
US 2016/0133798 A1 May 12, 2016

(30) Foreign Application Priority Data
Jun. 24, 2013 (DE) .................. 10 2013 106 575

(51) Int. Cl.
*H01L 33/00* (2010.01)
*H01L 33/50* (2010.01)
*C09K 11/02* (2006.01)
*C09K 11/77* (2006.01)
*H01L 33/48* (2010.01)

(52) U.S. Cl.
CPC ............ *H01L 33/501* (2013.01); *C09K 11/02* (2013.01); *C09K 11/7774* (2013.01); *H01L 33/483* (2013.01); *H01L 33/505* (2013.01); *H01L 2933/0033* (2013.01); *H01L 2933/0041* (2013.01)

(58) Field of Classification Search
CPC . H01L 33/501; H01L 33/502; H01L 33/505; H01L 33/483; C09K 11/02; C09K 11/7774
USPC ......................................... 257/98, 102, 103
See application file for complete search history.

(56) References Cited

U.S. PATENT DOCUMENTS

2015/0048399 A1*  2/2015  Weiler .................. H01L 33/502
                                                                    257/98

FOREIGN PATENT DOCUMENTS

| DE | 10 2005 020 168 A1 | 11/2006 |
| DE | 10 2006 054 331 A1 | 5/2008 |
| DE | 10 2009 010 468 A1 | 5/2010 |
| DE | 10 2012 102 859 A1 | 11/2013 |
| WO | 2006/097876 A1 | 9/2006 |

\* cited by examiner

*Primary Examiner* — Tu-Tu Ho
(74) *Attorney, Agent, or Firm* — DLA Piper LLP (US)

(57) ABSTRACT

An optoelectronic component includes a layer sequence having an active layer that emits electromagnetic primary radiation during operation, at least one conversion element arranged in a beam path of the primary radiation, wherein the at least one conversion element includes converter particles and a binder material, the converter particles are distributed in the binder material, the converter particles at least partly convert the primary radiation into electromagnetic secondary radiation, and the binder material is produced from a salt of two Formulae or from a mixture of different salts of one of the two Formulae, or from a mixture of different salts of the two Formulae.

10 Claims, 2 Drawing Sheets

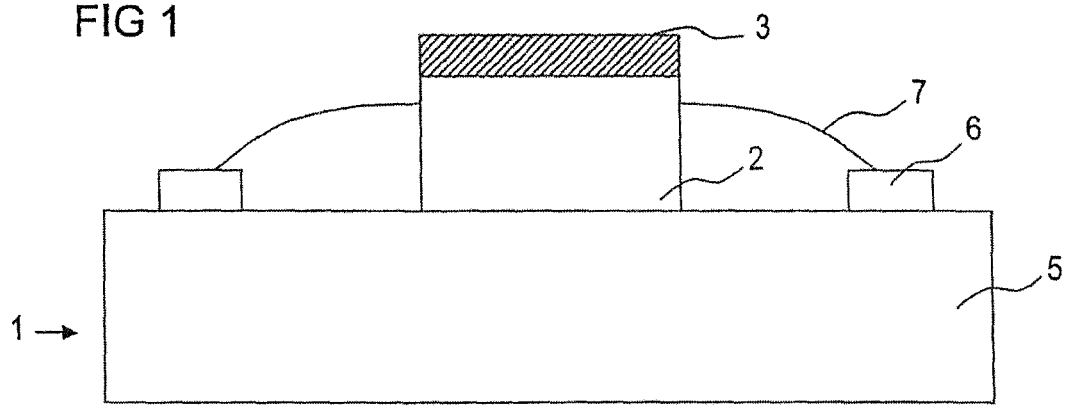
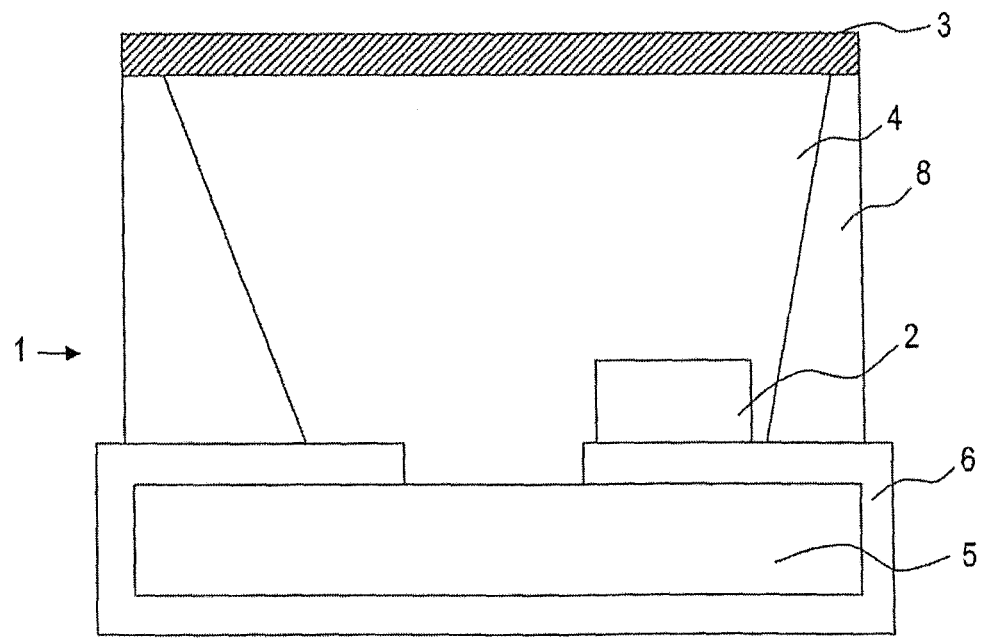

OPTOELECTRONIC COMPONENT INCLUDING A CONVERSION ELEMENT AND METHOD OF PRODUCING AN OPTOELECTRONIC COMPONENT INCLUDING A CONVERSION ELEMENT

TECHNICAL FIELD

This disclosure relates to an optoelectronic component comprising a conversion element, and to a method of producing an optoelectronic component comprising a conversion element.

BACKGROUND

Optoelectronic components such as light emitting diodes (LEDs), for example, often comprise conversion elements such as, for example, conversion laminae comprising a converter material. Converter materials convert the radiation emitted by a radiation source into a radiation having an altered, for example, longer wavelength. In that case, heat arises alongside the emitted radiation. Conventional conversion elements have inadequate heat dissipation of the heat arising as a result of the converter material. This gives rise to a heat accumulation in the conversion elements that leads to a reduction in the luminous intensity, an alteration of the color locus and a premature failure of the LED. Particularly in LEDs having a high energy efficiency (up to 150 lm/W) and a high luminous efficiency striven for, the heat cannot be dissipated efficiently enough with conventional conversion elements. Particularly to advance the use of LEDs as standard illuminants, a high energy efficiency of the LEDs is important. There are approaches to producing conversion elements made from inorganic-organic hybrid materials. Although the latter may be distinguished by an improved thermal conductivity compared to conversion elements composed of silicone, for example, they exhibit very rapidly negative aging phenomena such as cracking, opacification and yellowing on account of the organic radicals as a result of the action of radiation and temperature to which they are exposed in an LED. Furthermore, conventionally used materials in which the conversion material is embedded often have a different refractive index than the conversion material as a result of which radiation losses arise as a result of scattering and reflection and the efficiency of the components is thus reduced. On account of the silica constituents and polymeric groups present in conventional conversion elements, an increase in the refractive index above $\eta_D=1.5$ at 20° C. can be realized only with difficulty or cannot be realized. By contrast, frequently used conversion materials such as LuAG and YAG, for example, have a refractive index of approximately $\eta_D=1.7$ at 20° C.

It could, therefore, be helpful to provide an optoelectronic component comprising a conversion element having improved properties compared to known devices which, in addition, can be produced cost-effectively.

SUMMARY

We provide an optoelectronic component including a layer sequence having an active layer that emits electromagnetic primary radiation during operation of the component; at least one conversion element arranged in a beam path of the electromagnetic primary radiation, wherein the at least one conversion element includes converter particles and a binder material, the converter particles are distributed in the binder material, the converter particles at least partly convert the electromagnetic primary radiation into an electromagnetic secondary radiation, and the binder material is produced from a salt of Formulae I or II or from a mixture of different salts of Formula I or Formula II, or from a mixture of different salts of Formulae I and II, $$AHal_3 y H_2O \qquad (I)$$

$$A^*Hal^*_4 y^* H_2O \qquad (II)$$

wherein
  $A=Al^{3+}$ or $B^{3+}$,
  $A^*=Ti^{4+}$, $Zr^{4+}$, $Zn^{4+}$ or $Si^{4+}$,
  Hal=F, Cl, Br or I,
  Hal*=F, Cl, Br or I,
  y=0, 1, 2, 3, 4, 5 or 6,
  y*=0, 1, 2, 3, 4, 5 or 6.

We also provide a method of producing an optoelectronic component including a conversion element in a lamina form, including: B) providing a layer sequence having an active layer that emits electromagnetic primary radiation, C) producing a plate including: C1) producing a solution made from a solvent and a salt of Formulae I or II or from a mixture of different salts of Formula I or of Formula II, or from a mixture of different salts of Formulae I and II, $$AHal_3 y H_2O \qquad (I)$$

$$A^*Hal^*_4 y^* H_2O \qquad (II)$$

wherein
  $A=Al^{3+}$ or $B^{3+}$,
  $A^*=Ti^{4+}$, $Zr^{4+}$, $Zn^{4+}$ or $Si^{4+}$,
  Hal=F, Cl, Br or I,
  Hal*=F, Cl, Br or I,
  y=0, 1, 2, 3, 4, 5 or 6,
  y*=0, 1, 2, 3, 4, 5 or 6, C2) mixing the solution with converter particles, C3) applying the mixture into a planar mold, C4) removing the solvent, C6 liquefying the salt or the mixture of salts by increasing the temperature to a temperature T1, and C7) further increasing the temperature to a temperature T2 to form a binder material and the plate, D) separating the plate to form a plurality of laminae, and E) applying a lamina above the layer sequence.

We further provide a method of producing an optoelectronic component including a conversion element in a lamina form, including: B) providing a layer sequence having an active layer that emits electromagnetic primary radiation, C) producing a plate including: C1) producing a solution made from a solvent and a salt of Formulae I or II or from a mixture of different salts of Formulae I or of Formula II, or from a mixture of different salts of Formulae I and II, $$AHal_3 y H_2O \qquad (I)$$

$$A^*Hal^*_4 y^* H_2O \qquad (II)$$

wherein
  $A=Al^{3+}$,
  $A^*=Ti^4$,
  Hal=Cl,
  Hal*=Cl,
  y=0, 1, 2, 3, 4, 5 or 6,
  y*=0, 1, 2, 3, 4, 5 or 6,
  C2) mixing the solution with converter particles,
  C3) applying the mixture into a planar mold,
  C4) removing the solvent,
  C6) liquefying the salt or the mixture of salts by increasing the temperature to a temperature T1, and C7) further increasing the temperature to a temperature T2 to form a binder material and the plate,
D) separating the plate to form a plurality of laminae, and
E) applying a lamina above the layer sequence.

BRIEF DESCRIPTION OF THE DRAWINGS

FIGS. 1 and 2 show schematic side views of different examples of optoelectronic components.

DETAILED DESCRIPTION

Figure 3:
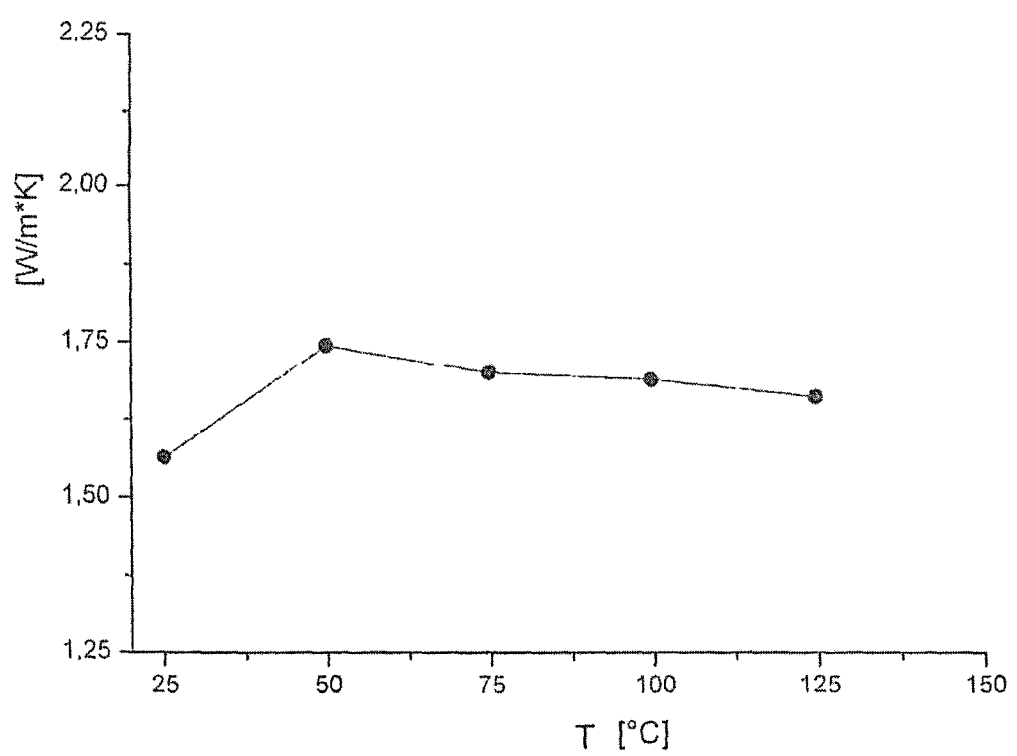
FIG. 3 shows the thermal conductivity of a conversion element.

Our optoelectronic component comprises a layer sequence having an active layer that emits electromagnetic primary radiation during operation of the component. Furthermore, the component comprises at least one conversion element arranged in the beam path of the electromagnetic primary radiation. The at least one conversion element comprises converter particles and a binder material, wherein the converter particles are distributed in the binder material. The converter particles at least partly convert the electromagnetic primary radiation into an electromagnetic secondary radiation. The binder material is produced from a salt of Formulae I or II or from a mixture of different salts of Formula I or of Formula II, or from a mixture of different salts of Formulae I and II,

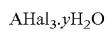  (I)

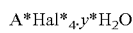  (II)

In the salts of Formulae I and II it holds true that:
A=$Al^{3+}$ or $B^{3+}$,
A*=$Ti^{4+}$, $Zr^{4+}$, $Zn^{4+}$ or $Si^{4+}$,
Hal=F, Cl, Br or I,
Hal*=F, Cl, Br or I,
y=0, 1, 2, 3, 4, 5 or 6,
y*=0, 1, 2, 3, 4, 5 or 6.

As a result of a conversion element comprising converter particles and a binder material, the heat arising as a result of the converter particles in the conversion element can be dissipated very well. As a result, only a small or negligible heat accumulation arises in the conversion element and a constant luminous intensity and a constant color locus can be guaranteed over the length of the operating period of the optoelectronic component. Consequently, a premature failure of the optoelectronic component can be prevented and the lifetime of the optoelectronic component can be lengthened. The binder material thus produced can have, as a result of a variation of its composition, a refractive index that almost or even exactly corresponds to that of the converter particles. As a result, scattering and refraction losses of the primary and/or secondary radiation in the conversion element can be avoided or largely avoided.

The fact that the converter particles at least partly convert the electromagnetic primary radiation into an electromagnetic secondary radiation can mean, first, that the electromagnetic primary radiation is at least partly absorbed by the converter particles and emitted as secondary radiation having a wavelength range at least partly different than that of the primary radiation. In this case, part of the absorbed primary radiation is emitted as heat by the converter particles. The electromagnetic primary radiation and electromagnetic secondary radiation can comprise one or a plurality of wavelengths and/or wavelength ranges in an infrared to ultraviolet wavelength range, in particular in a visible wavelength range. In this case, the spectrum of the primary radiation and/or the spectrum of the secondary radiation can be narrowband, that is to say that the primary radiation and/or the secondary radiation can have a single-colored or approximately single-colored wavelength range. The spectrum of the primary radiation and/or the spectrum of the secondary radiation can alternatively also be broadband, that is to say that the primary radiation and/or the secondary radiation can have a mixed-colored wavelength range, wherein the mixed-colored wavelength range can have a continuous spectrum or a plurality of discrete spectral components having different wavelengths. By way of example, the electromagnetic primary radiation can have a wavelength range from an ultraviolet to green wavelength range, while the electromagnetic secondary radiation can have a wavelength range from a blue to infrared wavelength range. Particularly preferably, the primary radiation and the secondary radiation superimposed can give a white-colored luminous impression. For this purpose, the primary radiation can preferably give a blue-colored luminous impression and the secondary radiation a yellow-colored luminous impression, which can arise as a result of spectral components of the secondary radiation in the yellow wavelength range and/or spectral components in the green and red wavelength range.

The fact that the converter particles at least partly convert the electromagnetic primary radiation into an electromagnetic secondary radiation can also mean that the electromagnetic primary radiation is almost completely absorbed by the converter particles and emitted in the form of an electromagnetic secondary radiation and in the form of heating. The emitted radiation of the optoelectronic component in accordance with this example thus corresponds almost completely to the electromagnetic secondary radiation. Almost complete conversion means a conversion above 90%, in particular above 95%.

In this context, "layer sequence" means a layer sequence comprising more than one layer, for example, a sequence of a p-doped and an n-doped semiconductor layer, wherein the layers are arranged one above another and at least one active layer that emits electromagnetic primary radiation is included.

The layer sequence can be an epitaxial layer sequence or a radiation-emitting semiconductor chip comprising an epitaxial layer sequence, that is to say as an epitaxially grown semiconductor layer sequence. In this case, the layer sequence can be based on InGaAlN, for example. InGaAlN-based semiconductor chips and semiconductor layer sequences are, in particular, those in which the epitaxially produced semiconductor layer sequence comprises a layer sequence composed of different individual layers containing at least one individual layer comprising a material from the III-V compound semiconductor material system $In_xAl_yGa_{1-x-y}N$ where $0 \leq x \leq 1$, $0 \leq y \leq 1$ and $x+y \leq 1$. Semiconductor layer sequences comprising at least one active layer on the basis of InGaAlN can emit, for example, electromagnetic radiation in an ultraviolet to green wavelength range.

Alternatively or additionally, the semiconductor layer sequence or the semiconductor chip can also be based on InGaAlP, that is to say that the semiconductor layer sequence can comprise different individual layers, at least one individual layer of which comprises a material from the III-V compound semiconductor material system $In_xAl_yGa_{1-x-y}P$ where $0 \leq x \leq 1$, $0 \leq y \leq 1$ and $x+y \leq 1$. Semiconductor layer sequences or semiconductor chips comprising at least one active layer on the basis of InGaAlP can emit, for example, preferably electromagnetic radiation having one or a plurality of spectral components in a green to red wavelength range.

Alternatively or additionally, the semiconductor layer sequence or the semiconductor chip can also comprise other III-V compound semiconductor material systems, for example, an AlGaAs-based material or II-VI compound semiconductor material systems. In particular, an active layer comprising an AlGaAs-based material can emit electromagnetic radiation having one or a plurality of spectral components in a red to infrared wavelength range.

Alongside the active layer, the active semiconductor layer sequence can comprise further functional layers and functional regions, for instance p- or n-doped charge carrier transport layers, that is to say electron or hole transport layers, undoped or p- or n-doped confinement, cladding or waveguide layers, barrier layers, planarization layers, buffer layers, protective layers and/or electrodes and combinations thereof. Furthermore, one or a plurality of mirror layers can be applied, for example, on a side of the semiconductor layer sequence facing away from the growth substrate. The structures described here concerning the active layer or the further functional layers and regions are known in particular with regard to construction, function and structure and, therefore, will not be explained in greater detail at this juncture.

The optoelectronic component can involve luminescence diodes, photodiode-transistor arrays/modules and optical couplers. Alternatively, it is possible to select an organic light emitting diode (OLED) as optoelectronic component. In particular, the optoelectronic component can be an LED having an efficiency of up to 150 lm/W.

The conversion element may have a thermal conductivity of 1 W/mK to 4.0 W/mK, 1.0 W/mK to 3.0 W/mK or 1.0 W/mK to 2.0 W/mK. The heat arising as a result of the converter particles in the conversion element can be dissipated very well in these ranges. The greater the thermal conductivity of the conversion element, the better the heat dissipation.

The conversion element may be produced by mixing the converter particles with a solution of a salt of Formulae I or II or a solution of a mixture of different salts of Formula I or of Formula II or from a solution of a mixture of different salts of Formulae I and II and subsequently liquefying the salt or the mixture of salts by temperature increase to a temperature T1. As a result of liquefying the salts, the salt molecules can freely move and be distributed. The liquid encloses the converter particles and fills pores that are present. Consequently, this already results in an initial densification of the subsequent binder material, that is to say of the liquefied salt or the mixture of the liquefied salts such that the conversion element has no or almost no pores or cracks as a result of this production method.

The temperature T1 may be greater than the melting point of the salts used. T1 can be 250° C. to 400° C.

$H_2O$ and HHal and/or HHal* and/or $Hal_2$ and/or $Hal*_2$ may arise during production of the binder material, these being present in the binder material only in slight amounts. In slight amounts means that, e.g., the halogen (Hal, Hal*) is still detectable during an analysis of the binder material or of the conversion element by mass spectroscopy. Consequently, even from the finished component it can be ascertained that the component was produced according to the method described. These slight amounts of $H_2O$ and HHal and/or HHal* and/or $Hal_2$ and/or $Hal*_2$ in the binder material do not have a disadvantageous effect on the component.

The binder material may comprise oxides of $Al^{3+}$, $B^{3+}$, $Ti^{4+}$, $Zr^{4+}$, $Zn^{4+}$ and/or $Si^{4+}$.

The converter particles may have a particle diameter of 1 μm to 50 μm. Preferably, the converter particles have a particle diameter of 5 to 15 μm, particularly preferably of 10 μm. Particularly in a particle size starting from 10 μm, the thermal conductivity of the conversion element is particularly high, which significantly increases the lifetime of the optoelectronic component.

The converter particles can be formed from one of the following phosphors, for example: garnets doped with rare earth metals, alkaline earth metal sulfides doped with rare earth metals, thiogallates doped with rare earth metals, aluminates doped with rare earth metals, silicates such as orthosilicates doped with rare earth metals, chlorosilicates doped with rare earth metals, alkaline earth metal silicon nitrides doped with rare earth metals, oxynitrides doped with rare earth metals and aluminum oxynitrides doped with rare earth metals, silicon nitrides doped with rare earth metals, sialons.

In particular, garnets such as yttrium aluminum oxide (YAG), lutetium aluminum oxide (LuAG) and terbium aluminum oxide (TAG) can be used as phosphors.

The phosphors are doped, for example, with one of the following activators: cerium, europium, terbium, praseodymium, samarium, manganese.

The conversion element may comprise converter particles of different phosphors.

The binder material may be transparent to the primary radiation emitted by the active layer of the layer sequence. In this case, "transparent" means that a material, a layer or an element is at least partly transmissive to the entire visible electromagnetic spectrum or a partial spectrum thereof. The primary radiation emitted by the layer sequence can lie in the visible range of the electromagnetic spectrum, for example.

The conversion element and/or the binder material may be transparent to the secondary radiation emitted by the converter particles.

Preferably, the binder material has a transparency of above 95%. Particularly preferably, the transparency of the binder material is above 98% for the emitted primary radiation and/or for the emitted secondary radiation.

The binder material may be produced from a salt of Formulae I or II or from a mixture of different salts of Formula I or Formula II or from a mixture of different salts of Formulae I and II, wherein no further salts are used during production.

The binder material may be produced exclusively from a salt of Formulae I or II or exclusively from a mixture of different salts of Formula I or of Formula II or exclusively from a mixture of different salts of Formulae I and II.

The conversion element may consist of converter particles and a binder material, wherein the binder material is produced exclusively from a salt of Formulae I or II or exclusively from a mixture of different salts of Formula I or of Formula II or exclusively from a mixture of different salts of Formulae I and II.

The converter particles may be present in an amount of 1 to 70 percent by weight relative to the binder material. 20 to 50 percent by weight is preferred; 30 to 40 percent by weight is particularly preferred.

The binder material may be produced from a salt of Formula I or from a mixture of different salts of Formulae I and II, wherein $A=Al^{3+}$ and $A*=Ti^{4+}$, $Zr^{4+}$ or $Zn^{4+}$.

The binder material may be produced from 50 to 95 mol percent, preferably from 70 to 95 mol percent, particularly preferably from 80 to 95 mol percent, of at least one compound of Formula I. With the variation of the proportion (in mol percent) of the compound of Formula II relative to the total amount of the proportions of Formulae I and II, the refractive index of the converter carrier layer can be varied and therefore optimized. Preferably, the refractive index of the binder material is matched to the refractive index of the converter particles and corresponds to the refractive index of the converter particles. In this regard, scattering and reflection losses of the primary and/or secondary radiation can be reduced and the efficiency of the optoelectronic component can be increased as a result.

The binder material is produced from $AlCl_3.6H_2O$. The binder material can be produced exclusively from $AlCl_3.6H_2O$. When the binder material is produced exclusively from $AlCl_3.6\ H_2O$, the binder material consists of $Al_2O_3$, $H_2O$, HCl and/or $Cl_2$.

The conversion element may consist of LuAG converter particles or YAG converter particles and a binder material produced exclusively from $AlCl_3.6H_2O$. In this example, the binder material has a refractive index of approximately $\eta_D=1.7$ at 20° C. Consequently, in this example, the refractive index of the binder material is matched to the refractive index of the converter particles, which for LuAG and YAG is also approximately $\eta_D=1.7$ at 20° C. No or almost no losses of the primary and/or secondary radiation as a result of scattering or reflection occur in such a conversion element. It has also been found that a conversion element comprising this material, as a result of temperature and moisture loadings to which it can be exposed in an optoelectronic component, and primarily as a result of the radiation loading to which it is exposed in an optoelectronic component, does not undergo or only slightly undergoes yellowing and opacification and changes scarcely or not at all in terms of its mechanical properties. This also ensures that the luminous efficiency is not reduced or reduced to a small extent and the emission characteristic of the optoelectronic component is not altered or only slightly altered. The mechanical strength of the conversion element can also be at least largely maintained despite the loadings. The heat arising as a result of the converter particles can be dissipated very well in the conversion element since the conversion element has a very good thermal conductivity. As a result, virtually no heat accumulation arises in the conversion element and a constant luminous intensity and a constant color locus can be guaranteed over the length of the operating period of the optoelectronic component.

The converter particles may be bound to the binder material by chemical bonds. Chemical bonds mean covalent bonds and ionic bonds. However, this is not a prerequisite for a crack- and pore-free or largely crack- and pore-free conversion element since the latter already has no or almost no pores and cracks in a manner governed by production. However, chemical bonding of the converter particles to the binder material can further support the almost crack- and pore-free production of the conversion element. Pore- and crack-free conversion elements ensure, over the entire conversion element, constant and efficient heat dissipation and a constant and efficient emission characteristic of the electromagnetic primary and/or secondary radiation.

The conversion element may be free or almost free of pores and cracks. This can be detected with the aid of micrographs recorded by a scanning electron microscope. The production method makes it possible to produce conversion elements up to a thickness of 100 μm to 200 μm in a manner free of pores and cracks or in a manner almost free of pores and cracks.

The conversion element may be a lamina.

The lamina may have a thickness of 1 μm to 200 μm, preferably 50 μm to 150 μm, particularly preferably 75 μm to 100 μm.

The optoelectronic component can comprise a housing. A cutout can be present in the center in the housing. The layer sequence can be fitted in the cutout. It is also possible for the cutout to be filled with a potting that covers the layer sequence. However, the cutout can also consist of an air space.

The conversion element may be a lamina arranged above the layer sequence.

The layer thickness of the entire lamina can be uniform. In this regard, a constant color locus can be obtained over the entire area of the lamina.

The lamina can be fitted directly on the layer sequence. It is possible for the lamina to cover the entire surface of the layer sequence.

The lamina may be arranged above the cutout of the housing. In this example of the conversion element, there is no direct and/or positively locking contact between the conversion element and the layer sequence. That is to say that there can be a spacing between the conversion element and the layer sequence. In other words, the conversion element is disposed downstream of the layer sequence and is irradiated by the primary radiation. A potting or an air gap can then be formed between the conversion element and the layer sequence.

The optoelectronic component may comprise at least one second layer sequence having one or a plurality of further active layers.

The first and the second and any further layer sequence may be arranged alongside one another. They can be arranged with a spacing or directly alongside one another.

It is also possible for a lamina to be applied directly on the first and the second and any further layer sequence. In this regard, the process of producing the optoelectronic component is controlled since a lamina need not be produced and applied for each layer sequence.

In this case, here and hereinafter the fact that one layer or one element is arranged or applied "on" or "above" another layer or another element can mean that the one layer or the one element is arranged directly in direct mechanical and/or electrical contact on the other layer or the other element. Furthermore, it can also mean that the one layer or one the element is arranged indirectly on or above the other layer or the other element. In this case, further layers and/or elements can then be arranged between the one layer or the other layer and/or between the one element or the other element.

An adhesion layer may be arranged between the layer sequence and the lamina or between the lamina and the housing. In addition, an adhesion layer can be arranged between the lamina and the potting.

Here and hereinafter, the fact that one layer or one element is arranged "between" two other layers or elements can mean that the one layer or the one element is arranged directly in direct mechanical and/or electrical contact or in indirect contact with one of the two other layers or elements and in direct mechanical and/or electrical contact or electrical or in indirect contact with others of the two other layers or elements. In the case of indirect contact, further layers and/or elements can then be arranged between the one layer and at least one of the two other layers and/or between the one element and at least one of the two other elements.

The adhesion layer can consist of silicone or an inorganic-organic hybrid material or comprise silicone or an inorganic-organic hybrid material. A good adhesive bonding of the layer sequence and of the lamina is possible by silicone and/or an inorganic-organic hybrid material. A good adhesive bonding of the lamina and of the housing and of the lamina with the potting is also possible. By the good adhesive bonding, a premature delamination of the lamina from the layer sequence or the housing and the potting is prevented and the lifetime of the optoelectronic component can thus be lengthened.

The adhesion layer can be applied over the whole area, in a structured fashion or in a punctiform fashion.

The converter particles may be distributed homogeneously or with concentration gradients in the binder material.

The specified example of the optoelectronic component can be produced in accordance with a method mentioned below. All features of the optoelectronic component mentioned under the method can also be features of the above-explained examples of the optoelectronic component.

We provide a method of producing an optoelectronic component comprising a conversion element. The conversion element is in the form of a lamina. The method comprises the following method steps:

B) providing a layer sequence having an active layer, wherein the active layer can emit electromagnetic primary radiation, C) producing a plate comprising the following method steps:

C1) producing a solution made from a solvent and a salt of Formulae I or II or from a mixture of different salts of Formula I or of Formula II, or from a mixture of different salts of Formulae I and II,

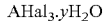
$$AHal_3 \cdot yH_2O \quad (I)$$

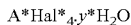
$$A^*Hal^*_4 \cdot y^*H_2O \quad (II)$$

wherein $A=Al^{3+}$ or $B^{3+}$, $A^*=Ti^{4+}$, $Zr^{4+}$, $Zn^{4+}$ or $Si^{4+}$, Hal=F, Cl, Br or I, Hal*=F, Cl, Br or I, y=0, 1, 2, 3, 4, 5 or 6, y*=0, 1, 2, 3, 4, 5 or 6, C2) mixing the solution with converter particles, C3) applying the mixture into a planar mold, C4) removing the solvent, C6) liquefying the salt or the mixture of salts by temperature increase to a temperature T1, C7) further temperature increase to a temperature T2 for forming a binder material and the plate, D) separating the plate to form a plurality of laminae, E) applying a lamina above the layer sequence.

As a result of the production of the laminae by separation from a large plate, the laminae can be produced cost-effectively and rapidly.

The mixture may be applied by blade coating or spin coating in method step C3).

A wet film of the mixture having a thickness of 100 μm to 600 μm, preferably 200 μm to 600 μm, particularly preferably 350 μm to 450 μm, may be formed in method step C3).

The solvent may be selected from a group comprising ethanol, isopropanol and acetonitrile. The solvent is preferably ethanol.

It is possible that the solvent is not completely evaporated in method step C4). Solvent residues are evaporated in method step C6).

The temperature T1 may be greater than the melting point of the salts used. T1 can be 250° C. to 400° C.

Method step C6) or C4) may be preceded by a further method step:

C5) introducing the planar mold into a furnace.

Method step C7) can be succeeded by a further method step:

C8) cooling the plate in the furnace until the furnace has cooled to room temperature. Room temperature is understood to mean a temperature of 25° C.

As a result of the slow cooling of the plate, this is implemented uniformly and in a stress-free manner and no or almost no cracks and pores are formed in the plate in this step.

In method step C7) and/or after the setting of the temperature T2, $H_2O$ and HHal and/or HHal* and/or $Hal_2$ and/or $Hal^*_2$ may be formed and partly evaporated. Consequently, only a very small proportion of $H_2O$ and HHal and/or HHal* and/or $Hal_2$ and/or $Hal^*_2$ remains in the plate. However, the proportion is high enough that it can be detected by mass spectroscopy in the finished plate. Consequently, even from the finished component it can be ascertained that the latter was produced from the method described.

If exclusively aluminum chloride hexahydrate, for example, is used as salt in method step C1), at least one of the following two reactions takes place in method step C7) and/or after the setting of the temperature T2:

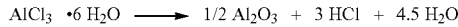
$$AlCl_3 \cdot 6H_2O \longrightarrow 1/2\, Al_2O_3 + 3\, HCl + 4.5\, H_2O$$

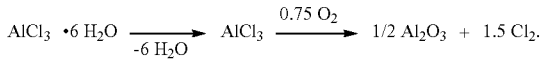
$$AlCl_3 \cdot 6H_2O \xrightarrow[-6H_2O]{} AlCl_3 \xrightarrow{0.75\, O_2} 1/2\, Al_2O_3 + 1.5\, Cl_2.$$

The first reaction is a dehydration and the second is a redox reaction, wherein $O_2$ is reduced and $Cl^-$ is oxidized. In this example, the conversion element thus consists of $Al_2O_3$, the converter particles and traces of HCl, $Cl_2$ and $H_2O$. Cl can be detected by mass spectroscopy.

If y and/or y*=0, in other words if salts containing no water of crystallization are used, in method step C7) and/or after the setting of the temperature T2, a redox reaction with the atmospheric oxygen takes place so that the binder material is formed. $H_2O$ and $Hal_2$ and/or $Hal^*_2$ arise in the process.

If salts having water of crystallization are used, that is to say if y=1, 2, 3, 4, 5 or 6 and/or y*=1, 2, 3, 4, 5 or 6, in method step C7) and/or after the setting of the temperature T2, a dehydration characterized by formation of $H_2O$ and HHal and/or HHal* and a redox reaction characterized by formation of $H_2O$ and $Hal_2$ and/or $Hal^*_2$ can proceed alongside one another. It is also possible for only one of the two reactions to proceed.

It is possible for $H_2O$ and HHal and/or HHal* and/or $Hal_2$ and/or $Hal^*_2$ to arise and partly evaporate also as early as before method step C7), that is to say in or after method step C6).

The temperature increases in method step C6) and/or C7) may take place with constant heating rates. The heating rate is 2° C. to 10° C. per minute. Preferably, the heating rate is 4° C. to 10° C. per minute, particularly preferably 6° C. per minute. As a result of the heating rates, a controlled liquefaction of the salt or of the mixture of salts takes place. Solvent residues that were possibly still not completely removed in method step C4) are evaporated, without the occurrence of base formation or boiling delays.

After method step C6), the mixture may be kept constant at the temperature T1 for one to three hours. A method step C6') "keeping the mixture at constant temperature T1 for 1 h to 3 h" takes place. This makes it possible to ensure that the salts or the mixture of salts are or is completely liquefied.

After method step C7) or C6'), the mixture may be kept at a temperature of T2 for one to three hours. A method step C7') "keeping the mixture at constant temperature T2" for 1 h to 3 h, takes place. It can thus be ensured that the salts used are completely or almost completely reacted. In other words, it can be ensured that the salts used almost completely undergo a dehydration and/or a redox reaction. Furthermore, stresses can be reduced.

T2 may be 450° C. to 550° C.

Method step B) may be preceded by a further method step:
A) shaping a housing having a cutout,
wherein method step B) is then succeeded by a further method step B'):
B') introducing the layer sequence into the cutout of the housing.

The lamina in method step E) may be applied directly on the layer sequence or with an adhesion layer on the layer sequence.

In method step E) the lamina may be applied above the cutout of the housing.

Further advantages and developments will become apparent from the examples described below in association with the figures.

In the examples and figures, identical or identically acting constituent parts are provided with the same reference signs. The illustrated elements and their size relationships among one another should not be regarded as true to scale. Rather, individual elements, in particular layer thicknesses, may be illustrated with an exaggerated size to afford a better understanding.

The optoelectronic component 1 in accordance with FIG. 1 exhibits a carrier 5 with a leadframe 6. A layer sequence 2 is arranged on the carrier 5 and electrically connects to the leadframe 6 via bonding wires 7. A conversion element 3 in the form of a lamina is fitted above the layer sequence 2. The conversion element 3 comprises converter particles composed of LuAG and a binder material, wherein the converter particles are homogeneously distributed in the binder material. The binder material is produced from $AlCl_3 \cdot H_2O$. The lamina is arranged in the beam path of the electromagnetic primary radiation emitted by an active layer (not illustrated separately here) in the layer sequence 2. The refractive indices of the binder material and of the converter particles are both approximately $\eta_D=1.7$ at 20° C. Therefore, no or almost no losses of the primary and/or secondary radiation as a result of scattering or reflection occur in this conversion element. Moreover, the conversion element is stable with respect to temperature, moisture and radiation loadings. It undergoes no or only slight opacification and undergoes no or only slight yellowing. This ensures that the luminous efficiency is not reduced or reduced to a small extent and the emission characteristic of the optoelectronic component is not altered or only slightly altered. The mechanical strength of the conversion element can also be at least largely maintained despite the loadings.

In addition, an adhesion layer (not shown here) can be fitted between the layer sequence 2 and the conversion element 3. The adhesion layer can comprise silicone, for example.

Preferably, the optoelectronic component 1 is an LED, wherein the radiation is coupled out toward the top via a transparent semiconductor layer sequence 2 and the conversion element 3.

The optoelectronic component 1 in accordance with FIG. 2 exhibits a carrier 5 with a leadframe 6 and a housing 8. The housing 8 has a cutout in the center, the layer sequence 2 being arranged in the cutout, the layer sequence electrically conductively connecting to the leadframe 6. The cutout is filled with a potting material 4. The potting material 4 comprises an epoxy, for example.

A conversion element 3 is arranged above the cutout of the housing 8 and the housing 8. The conversion element 3 is in the form of a lamina and arranged in the beam path of the electromagnetic primary radiation emitted by an active layer (not illustrated separately here) in the layer sequence 2.

The conversion element 3 comprises converter particles and a binder material, wherein the converter particles are homogeneously distributed, for example, in the binder material. The binder material is produced from $AlCl_3 \cdot 6H_2O$ and $TiCl_4$.

In addition, an adhesion layer (not shown here) can be fitted between the housing and the conversion element 3 and between the potting material 4 and the conversion element 3. The adhesion layer can comprise silicone, for example.

Preferably, the optoelectronic component 1 is an LED, wherein the radiation is coupled out toward the top via a transparent semiconductor layer sequence 2, a transparent potting material 4 and the conversion element 3.

FIG. 3 shows the thermal conductivity of a conversion element in the form of a lamina having a thickness of 85 μm to 100 μm and an area of 10 mm×10 mm. The thermal conductivity in W/mK is plotted on the y-axis and the temperature T in ° C. is plotted on the x-axis.

The conversion element from FIG. 3 was produced as follows:
C1) producing a 1-molar solution of $AlCl_3 \cdot 6H_2O$ in ethanol,
C2) mixing the solution with LuAG converter particles,
C3) applying the mixture into a planar mold by blade coating/spin coating to form a film having a thickness of approximately 400 μm,
C4) removing the ethanol,
C5) introducing the planar mold into a furnace,
C6) liquefying the salt $AlCl_3 \cdot 6H_2O$ by a temperature increase to a temperature T1 of 350° C. with a heating rate of 6° C. per minute,
C6') keeping the mixture at constant temperature T1 of 350° C. for 1.5 h,
C7) further temperature increase to a temperature T2 of 550° C. with a heating rate of 6° C. per minute to form the binder material and the plate, wherein $H_2O$ and HCl and/or $Cl_2$ arise and almost completely evaporate,
C7') keeping the mixture at constant temperature T2 of 550° C. for 1.5 h,
C8) cooling the plate in the furnace until the furnace has cooled to room temperature,
D) separating the plate to form a plurality of laminae. The ratio of $AlCl_3 \cdot 6H_2O$ to LuAG converter particles is chosen such that a weight ratio of the LuAG converter particles with respect to the binder material of approximately 1:1 is present in the laminae. The presence of chlorine in the binder material can be detected by mass spectroscopy such that in the finished laminae the production method thereof can be deduced.

It is evident from FIG. 3 that the conversion element thus produced has a thermal conductivity of approximately 1.5 W/mK to 1.75 W/mK, at temperatures of 25° C. to 125° C. In comparison therewith, conventional conversion elements composed of pure silicone have a thermal conductivity of approximately 0.1 W/mK to 0.15 W/mK in this temperature range. The thermal conductivity of the conversion elements is thus considerably improved compared to conventional conversion elements. The heat arising as a result of the converter particles can be dissipated very well in the conversion element. As a result, only a small or negligible heat accumulation arises in the conversion element and a constant luminous intensity and a constant color locus can be guaranteed over the length of the operating period of the optoelectronic component. Consequently, a premature failure of the optoelectronic component can be prevented and the lifetime of the optoelectronic component can be lengthened. Almost identical values are also obtained if YAG converter particles are used instead of LuAG converter particles.

Our components and methods are not restricted by the description on the basis of the examples. Rather, this disclosure encompasses any novel feature and also any combination of features, which in particular includes any combination of features in the appended claims, even if the feature or combination itself is not explicitly specified in the claims or examples.

This application claims the priority of DE 10 2013 106 575.9, the content of which is hereby incorporated by reference.

The invention claimed is:

1. A method of producing an optoelectronic component comprising a conversion element in a lamina form, comprising:
   B) providing a layer sequence having an active layer that emits electromagnetic primary radiation,
   C) producing a plate comprising:
   C1) producing a solution made from a solvent and a salt of Formulae I or II or from a mixture of different salts of Formula I or of Formula II, or from a mixture of different salts of Formulae I and II, $$AHal_3 \cdot yH_2O \qquad (I)$$

$$A^*Hal^*_4 \cdot y^*H_2O \qquad (II)$$

wherein
   $A=Al^{3+}$ or $B^{3+}$,
   $A^*=Ti^{4+}$, $Zr^{4+}$, $Zn^{4+}$ or $Si^{4+}$,
   Hal=F, Cl, Br or I,
   Hal*=F, Cl, Br or I,
   y=0, 1, 2, 3, 4, 5 or 6,
   y*=0, 1, 2, 3, 4, 5 or 6,
   C2) mixing the solution with converter particles,
   C3) applying the mixture into a planar mold,
   C4) removing the solvent,
   C6) liquefying the salt or the mixture of salts by increasing the temperature to a temperature T1, and
   C7) further increasing the temperature to a temperature T2 to form a binder material and the plate,
   D) separating the plate to form a plurality of laminae, and
   E) applying a lamina above the layer sequence.

2. The method according to claim 1, wherein the solvent is selected from the group consisting of ethanol, isopropanol and acetonitrile.

3. The method according to claim 1, wherein method step C6) is preceded by a further method step:
   C5) introducing the planar mold into a furnace, and
   method step C7) is succeeded by a further method step:
   C8) cooling the plate in the furnace until the furnace has cooled to room temperature.

4. The method according to claim 1, wherein, in method step C7) and/or after the setting of the temperature T2, $H_2O$ and HHal and/or HHal* and/or $Hal_e$ and/or $Hal^*_2$ arise and partly evaporate.

5. The method according to claim 1, wherein temperature increases in method steps C6) and C7) are effected at constant heating rates.

6. The method according to claim 1, wherein, after method step C6), in a method step C6'), the mixture is kept constant at the temperature T1 for 1 to 3 h.

7. The method according to claim 1, wherein method step B) is preceded by a further method step:
   A) shaping a housing having a cutout, and
   method step B) is succeeded by a further method step:
   B') introducing the layer sequence into the cutout of the housing.

8. The method according to claim 1, wherein the lamina in method step E) is applied directly on the layer sequence or with an adhesion layer on the layer sequence.

9. The method according to claim 7, wherein, in method step E), the lamina is applied above the cutout of the housing.

10. A method of producing an optoelectronic component comprising a conversion element in a lamina form, comprising:
    B) providing a layer sequence having an active layer that emits electromagnetic primary radiation,
    C) producing a plate comprising:
    C1) producing a solution made from a solvent and a salt of Formulae I or II or from a mixture of different salts of Formula I or of Formula II, or from a mixture of different salts of Formulae I and II, $$AHal_3 \cdot yH_2O \qquad (I)$$

$$A^*Hal^*_4 \cdot y^*H_2O \qquad (II)$$

wherein
    $A=Al^{3+}$,
    $A^*=Ti^4$,
    Hal=Cl,
    Hal*=Cl,
    y=0, 1, 2, 3, 4, 5 or 6,
    y*=0, 1, 2, 3, 4, 5 or 6,
    C2) mixing the solution with converter particles,
    C3) applying the mixture into a planar mold,
    C4) removing the solvent,
    C6) liquefying the salt or the mixture of salts by increasing the temperature to a temperature T1, and
    C7) further increasing the temperature to a temperature T2 to form a binder material and the plate,
    D) separating the plate to form a plurality of laminae, and
    E) applying a lamina above the layer sequence.

* * * * *

UNITED STATES PATENT AND TRADEMARK OFFICE
CERTIFICATE OF CORRECTION

PATENT NO. : 9,490,400 B2  
APPLICATION NO. : 14/897343  
DATED : November 8, 2016  
INVENTOR(S) : Pihale et al.

Page 1 of 1

It is certified that error appears in the above-identified patent and that said Letters Patent is hereby corrected as shown below:

On the Title Page

At item (71) Applicant, please change "Regonsburg" to --Regensberg--.

In the Claims

In Column 14, at Line 9, please change "$Hal_e$" to --$Hal_2$--.

Signed and Sealed this  
Twenty-eighth Day of February, 2017

Michelle K. Lee  
*Director of the United States Patent and Trademark Office*